United States Patent [19]
Boecking

[11] Patent Number: 6,025,671
[45] Date of Patent: Feb. 15, 2000

[54] PIEZOELECTRIC ACTUATOR

[75] Inventor: Friedrich Boecking, Stuttgart, Germany

[73] Assignee: Robert Bosch GmbH, Stuttgart, Germany

[21] Appl. No.: 09/037,480

[22] Filed: Mar. 10, 1998

[30] Foreign Application Priority Data

Mar. 27, 1997 [DE] Germany ............................ 197 12 923

[51] Int. Cl.[7] .................................................. H01L 41/08
[52] U.S. Cl. ........................................... 310/369; 310/328
[58] Field of Search ..................... 310/328, 369

[56] References Cited

U.S. PATENT DOCUMENTS

| | | | |
|---|---|---|---|
| 3,110,825 | 11/1963 | Miller | 310/369 |
| 3,215,078 | 11/1965 | Stec | 310/369 |
| 4,087,715 | 5/1978 | Myer | 310/317 |
| 4,945,235 | 7/1990 | Nishioka et al. | 250/306 |
| 4,958,100 | 9/1990 | Crawley et al. | 310/328 |
| 5,198,715 | 3/1993 | Elings et al. | 310/328 |
| 5,214,342 | 5/1993 | Yang | 310/328 |
| 5,481,152 | 1/1996 | Buschulte | 310/328 |

FOREIGN PATENT DOCUMENTS

| | | | |
|---|---|---|---|
| 0 106 483 | 9/1983 | European Pat. Off. | G12B 1/00 |
| 3533085 A1 | 3/1987 | Germany | B05B 1/30 |
| 4306073 C1 | 6/1994 | Germany | F04B 13/00 |
| 19500706 A1 | 7/1996 | Germany | F16K 31/02 |
| 2 239 554 | 7/1991 | United Kingdom | H01L 41/09 |

OTHER PUBLICATIONS

Agrait, Vertical inertial piezoelectric translation device for a scanning tunneling microscope, Rev. Sci. Instrum., vol. 63, pp.263–264, Oct. 1991.

*Primary Examiner*—Thomas M. Dougherty
*Attorney, Agent, or Firm*—Kenyon & Kenyon

[57] ABSTRACT

A piezoelectric actuator has at least one monolithic piezoelement of a piezoelectric material, having a tubular form and a penetrating bore extending along a longitudinal direction surrounded by a tubular wall. An inner electrode is provided on the inside of the tubular wall of each piezoelement. Correspondingly, an outer electrode is provided on the outside of the tubular wall of each piezoelement. When an electric voltage is applied between the inner electrode and the outer electrode, an electrical field is formed that is essentially aligned perpendicularly to the longitudinal direction of the tubular piezoelement, the electrical field effecting a deformation of the piezoelement in its longitudinal direction in order to exert an actuation force in the longitudinal direction of the piezoelement.

15 Claims, 1 Drawing Sheet

PIEZOELECTRIC ACTUATOR

FIELD OF THE INVENTION

The present invention relates to a piezoelectric actuator, which can be used, in particular, for actuating a fuel injector.

BACKGROUND INFORMATION

In a fuel injector known from German Patent No. DE 35 33 085 A1, a piezoelectric actuator is provided for actuating a valve-closure member to seal off a spray orifice, the valve-closure member being operatively connected with force-locking by way of a transfer bolt to a valve needle coupled to the valve-closure member. The piezoelectric actuator is comprised of a plurality of piezoelements arranged one behind the other in a stack. The piezoelements have a disk shape and, on both disk surfaces, have electrodes capable of receiving an electric voltage. When voltage is applied, each of the disk-shaped piezoelements, arranged one behind the other in a stack, expands in the direction of the electrical field being formed between the electrodes.

Since the expansion of the piezoelements used for the valve lift is in the direction of the electrical field, the electrodes are arranged, of necessity, on surfaces extending normal to the expansion direction. To achieve a high enough electrical field strength in each piezoelement, the layer thickness of the piezoelements must not be too great. Therefore, to achieve sufficient valve lift, it is necessary for a large number of thin piezoelements to be disposed in a stack, one behind the other, and to be pressed against one another with a suitable mechanical prestressing in the expansion direction. Since the electrodes run parallel to the contact surface where the individual piezoelements lie together contiguously, a monolithic manufacturing of the piezoelectric actuator is not possible.

Fuel injectors having a hydraulic displacement transformer are described in German Patent No. DE 43 06 073 C1 and German Patent No. DE 195 00 706 A1, where a relatively small displacement of a working piston coupled to the piezoelectric actuator is transformed into a substantially larger displacement of a reciprocating piston coupled to the valve-closure member. In this case, the piezoelectric actuators are comprised of a number of stacked piezoelements.

A drawback of the known piezoelectric actuators is that a costly manufacturing process is required to produce them. An additional drawback is that tensile stress may not be applied to the piezoelectric actuators, since this would entail the risk of the electrodes that are vapor- or sputter-deposited onto the piezoelectric crystals becoming detached. To counteract this, a mechanical compressive prestressing of the known piezo-actuators is necessary, requiring additional components.

SUMMARY OF THE INVENTION

An object of the present invention is to provide an actuator having piezoelements that are inexpensive and uncomplicated to produce. An extrusion molding method, e.g., which would enable the piezoelements to be produced with a relatively substantial structural length as a monolith, presents itself here.

The outer electrode and the inner electrode of the piezoelement can be easily applied inside and outside of the tubular wall of the tubular piezoelement over a large surface, e.g., by means of sputtering, vapor deposition, a CVD process, or another known coating process. Since the electrodes are disposed parallel to the actuating direction of the actuator, and there is no need for electrodes disposed transversely to the actuating direction, it is possible to produce the actuator from a monolithic, piezoelectric crystal that is not interrupted by electrodes.

In contrast to related-art actuators, the actuator of the present invention can also receive a tensile stress, since when working with the electrode configuration of the present invention, there is no risk of the electrodes becoming detached from the piezoelectric crystal in response to a tensile stress. Therefore, in the case of the actuator of the present invention, one can eliminate the special components required in the related art to mechanically prestress the actuator, making it possible to further reduce manufacturing and assembly costs.

When a plurality of piezoelements designed in accordance with the present invention are used, e.g., two piezoelements mechanically connected in series, the lift of the piezoelectric actuator can be increased at a given structural length, i.e., the length of the piezoelectric actuator can be shortened at a given lift. The piezoelements designed in accordance with the present invention utilize the so-called $d_{31}$ effect (described later in greater detail), while the piezoelements known from the related art utilize the so-called $d_{33}$ effect (likewise described later in greater detail). Given the same mechanical length of the piezoelectric actuator, the lift attainable by utilizing the $d_{31}$ effect is only roughly half of the lift attainable by utilizing the $d_{33}$ effect. However, by using two piezoelements designed in accordance with the present invention, nested one inside the other, and mechanically connected in series, a total lift comparable to the $d_{33}$ effect is attained. Also, when two or more piezoelements, which are nested one inside the other, are used, the total costs for manufacturing a piezoelectric actuator of the present invention are less than the costs that need to be expended for a related-art piezoelectric actuator, since, in comparison, the individual piezoelements can be produced extremely cost-effectively, e.g., using an extrusion molding process.

According to the present invention, an especially space saving arrangement of two or more piezoelements that are mechanically connected, one behind the other, is achieved when an outer piezoelement is concentrically disposed, in each case, around an inner piezoelement, and when a connecting element joins one end of the inner piezoelement to the opposite end of the outer piezoelement. The connecting element can be integrated quite advantageously in an annular space between the inner piezoelement and the outer piezoelement. This results in an especially compact type of construction for the piezoelectric actuator of the present invention.

The electrodes of the individual piezoelements can be electrically connected in parallel or independently of one another to a voltage source. In the latter case, a stepped driving of the piezoelectric actuator is possible, the result being a graduated actuator lift, depending on how many piezoelements receive the electric voltage.

DETAILED DESCRIPTION

Figure 1:
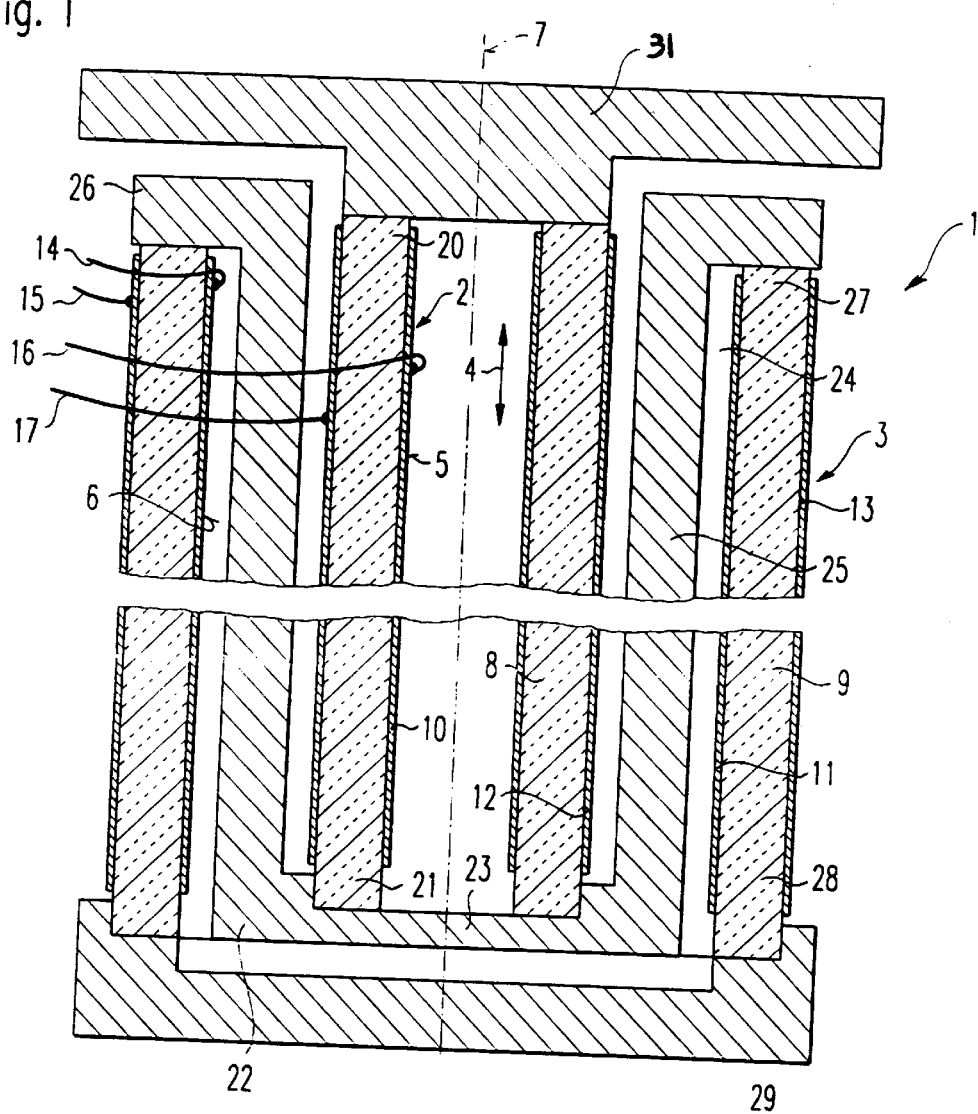
FIG. 1 shows an axial section through an exemplary piezoelectric actuator according to the present invention.

FIG. 1 shows an axial section through an exemplary piezoelectric actuator 1 of the present invention. Piezoelectric actuator 1 can be used, for example, to actuate a valve-closure member of a fuel injector, not shown in greater detail, in particular for direct-fuel injection. However, a multiplicity of other application possibilities are also conceivable, e.g., the actuation of hydraulic valves, the driving of micropumps, or the actuation of electrical relays.

In the exemplary embodiment that is only shown schematically, piezoelectric actuator 1 has two piezoelements 2, 3, nested one inside the other, namely an inner piezoelement 2 and an outer piezoelement 3. Both inner piezoelement 2 and outer piezoelement 3 are produced from a piezoelectric material as a monolith, i.e., as a monocrystal. Suitable materials are, for example, quartz, tourmaline, barium titanate ($BaTiO_3$) or special piezoceramics, e.g. of Ba- and Ti-salts. Organic salts, such as NaK-tartrate or many other known piezoelectric materials are also suited.

In accordance with the present invention, piezoelements 2, 3 have a tubular, i.e., sleeve-shaped design, and have in each case penetrating bores 5, 6, which extend along a longitudinal direction illustrated by arrow 4. In one preferred exemplary embodiment, piezoelements 2, 3 are designed in radial symmetry as hollow cylinders of different diameters, which are arranged concentrically to a longitudinal axis 7. Penetrating bores 5 or 6 are each surrounded by a tubular wall 8 or 9. On the inside of tubular wall 8 or 9, provision is made for an inner electrode 10 and 11, respectively, while on the outside of tubular wall 8 or 9, provision is made for an outer electrode 12 and 13, respectively. Inner electrodes 10 and 11, and outer electrodes 12 and 13 are made of a suitable metal, which is applied using a suitable coating process, e.g., by means of sputter or vapor deposition, or a CVD process, to the inner or outer periphery of tubular walls 8 and 9. Inner electrodes 10 and 11, as well as outer electrodes 12 and 13 are connected to electrical lines 14 through 17, which are shown schematically.

When an electric voltage is applied to electrical lines 14 and 15, on the one hand, and to electrical lines 16 and 17, on the other hand, within tubular walls 8 or 9, an electrical field is formed that is aligned radially to longitudinal axis 7. Depending on the direction of the field strength, the electric field causes piezoelement 2 or 3 in question to contract or expand in longitudinal direction 4, thus normal to the direction of the electric field. The deformation in the direction normal to the direction of the electric field is more or less half as great as the deformation in the direction of the electric field utilized in conventional actuators. Given the same structural length of piezoelectric actuator 1, this leads to a corresponding reduction in the actuation lift. This can be compensated, as shown in FIG. 1, by using two piezoelements 2 and 3, which are mechanically connected in series and nested one inside the other. In this context, outer piezoelement 3 concentrically surrounds inner piezoelement 2.

A first end 20 of inner piezoelement 2 is braced against a support member, e.g., against housing 31 of a fuel injector. A second end 21 of inner piezoelement 2 is joined to a connecting element 22, which mechanically couples inner piezoelement 2 and outer piezoelement 3 to one another. Connecting element 22 can have a pot-shaped design, for example, with a cup-type base 23, against which second end 21 of inner piezoelement 2 is braced, with a cylinder section 25 running in an annular space 24 formed between inner piezoelement 2 and outer piezoelement 3, and with a peripheral collar 26 integrally formed on the end facing away from cup-shaped base 23 on cylinder section 25, a first end 27 of outer piezoelement 3 being braced against said collar 26. In this context, first end 27 of outer piezoelement 3 is disposed so as to face the first end 20 of inner piezoelement 2 and so as to oppose second end 21 of inner piezoelement 2. A second end 28 of outer piezoelement 3 is joined to a reciprocating piston 29, which transfers the actuating force of actuator 1 of the present invention to corresponding actuating elements, e.g., to a valve needle or a hydraulic displacement transformer of a fuel injector.

An extremely compact type of construction results from the nesting arrangement of two piezoelements 2 and 3 shown in FIG. 1, with an actuating lift comparable to that of a conventional actuator. Of course, other piezoelements can also be configured in the same kind of nesting arrangement, a third piezoelement (not shown) concentrically surrounding piezoelement 3 being connected to piezoelement 3 with a corresponding further connecting element. A fourth piezoelement and other piezoelements can be arranged in a corresponding manner, with each of the piezoelements being connected to the next inner piezoelement via a connecting element in such a way that the ends of the inner piezoelement in question oppositely disposed in the longitudinal direction and of the surrounding outer piezoelement in question are operatively connected to one another with force-locking.

Electrical lines 14 through 17 can be so connected that inner electrodes 10 and 11, on the one hand, and outer electrodes 12 and 13, on the other hand, are each able to be linked to a pole of a shared voltage source. It is also conceivable, however, to connect electrodes 10, 12 of inner piezoelement 2 and electrodes 11, 13 of outer piezoelement 3 independently of one another to the voltage source, so that piezoelements 2, 3 can receive a supply voltage independently of one another. In this manner, a stepped actuation lift of actuator 1 of the present invention can be achieved, a first actuation lift stage being achieved when only one of the two piezoelements 2 or 3 receive the supply voltage, and a second actuation lift stage being achieved, when both piezoelements 2 and 3 receive the supply voltage. When piezoelectric actuator 1 of the present invention is used to actuate a valve-closure member of a fuel injector, a stepped valve opening lift results, which is advantageous for certain applications.

Piezoelements 2 and 3 are able to be produced quite advantageously as a monolith using an extrusion molding process. In this context, particularly low manufacturing costs are achieved for piezoelements 2, 3.

Figure 2:
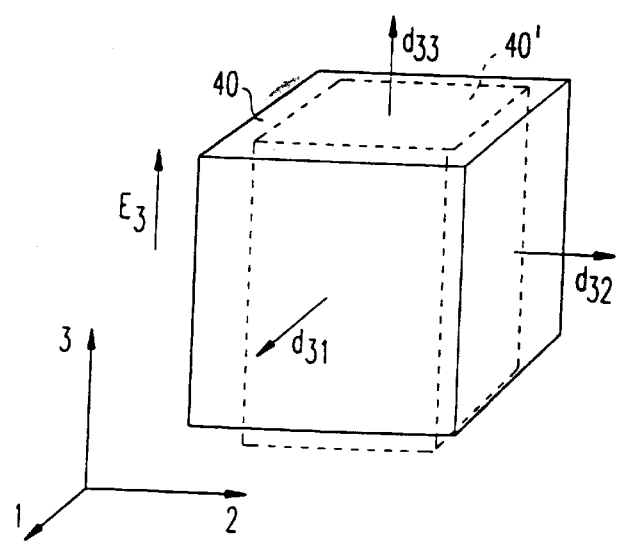
FIG. 2 shows a schematic representation of an exemplary mode of operation according to the present invention.

To enable a better understanding of the present invention, on the basis of FIG. 2, the following will elucidate the $d_{31}$ effect utilized in the present invention, as contrasted to the $d_{33}$ effect usually used in known piezoactuators.

For the sake of simplicity, in FIG. 2, piezoelectric crystal 40, shown in a cube shape, is sketched in a coordinate system, whose coordinates are denoted by 1, 2 and 3. When an electric field $E_i$ acting in coordinate direction I is applied to piezoelectric crystal 40, the crystal 40 undergoes a deformation, transforming it into piezoelectric crystal 40' shown in FIG. 2 with a dashed line, for the case that I=3. Between the relative deformation:

$$\varepsilon_i = \Delta x_i / x_i \quad I = 1, 2, 3 \tag{1}$$

in coordinate direction I and an electric field $E_j$ in coordinate direction j, the three-dimensional relation $$E_j = d_{ji}\varepsilon_i \quad I = 1, 2, 3 \quad j = 1, 2, 3 \qquad (2)$$

generally applies. In this context, $d_{ji}$ denotes the piezoelectric coefficient, which is also described as piezoelectric charge constant.

When, as in FIG. 2, electrical field $E_3$ acts in coordinate direction 3, piezoelectric coefficient $d_{33}$ is an index for the field-dependent deformation in the direction of electric field $E_3$, while piezoelectric coefficients $d_3$, and $d_{32}$ are an index for the field-dependent deformation normal to the direction of electrical field $E_3$, thus in the direction of coordinates 1 or of coordinates 2. When piezoelectric crystal 40 undergoes an expansion in coordinate direction 3, as shown in FIG. 2, then it undergoes a corresponding contraction normal to the direction of electrical field $E_3$. Therefore, in this Application, the deformation in the direction of electrical field $E_3$ is denoted as the $d_{33}$ effect, while the deformation in coordinate direction I normal to the direction of electrical field $E_3$ is designated as the $d_3$, effect. While conventional actuators utilize, as a rule, the $d_{33}$ effect, actuator 1 of the present invention makes use of the $d_3$, effect or the $d_{32}$ effect, thus a deformation that is transverse to the direction of electrical field $E_3$. When working with an isotropic, piezoelectric crystal 40, the contraction in coordinate direction 1 or in coordinate direction 2, is about half as great as the expansion in coordinate direction 3.

What is claimed is:

1. A piezoelectric actuator, comprising:
   at least one monolithic piezoelement of a piezoelectric material, having a first end and a second end and a tubular form and a penetrating bore extending along a longitudinal direction and surrounded by a tubular wall, the at least one piezoelement including a first piezoelement having a first end and a second end and at least one outer piezoelement having a first end and a second end, wherein the at least one outer piezoelement is concentrically disposed around the first piezoelement and connected by a connecting element, the connecting element connecting the second end of the first piezoelement to the first end of the at least one outer piezoelement, the first end of the first piezoelement and the first end of the at least one outer piezoelement both being oriented toward the first end of the at least one monolithic piezoelement, the second end of the first piezoelement and the second end of the at least one outer piezoelement both being oriented toward the second end of the at least one monolithic piezoelement, a distance from the second end of the first piezoelement to the first end of the at least one outer piezoelement being less than a distance from the first end of the first piezoelement to the second end of the least one outer piezoelement;
   at least one inner electrode provided on an inside of the tubular wall surrounding the at least one piezoelement; and
   at least one outer electrode provided on an outside of the tubular wall surrounding the at least one piezoelement, wherein when an electric voltage is applied between the at least one inner electrode and the at least one outer electrode an electrical field aligned substantially perpendicularly to the longitudinal direction of the at least one piezoelement is formed, wherein the electrical field deforms the at least one piezoelement in the longitudinal direction causing the at least one piezoelement to exert an actuation force in the longitudinal direction.

2. The piezoelectric actuator according to claim 1, wherein the first piezoelement and the at least one outer piezoelement are in radial symmetry and arranged concentrically around a shared longitudinal axis running in the longitudinal direction.

3. The piezoelectric actuator according to claim 2, wherein the connecting element is in radial symmetry with the first piezoelement and the at least one outer piezoelement and is arranged concentrically around the longitudinal axis common to the first piezoelement and the at least one outer piezoelement.

4. The piezoelectric actuator according to claim 1, wherein the first piezoelement has a tubular form and an inside surface and an outside surface and the at least one outer piezoelement has a tubular form and an inside surface and an outside surface, further comprising at least one inner electrode provided on the inside surface of the first piezoelement, at least one outer electrode provided on the outside surface of the first piezoelement at least one inner electrode provided on the inside surface of the at least one outer piezoelement, and at least one outer electrode provided on the outside surface of the at least one outer piezoelement, wherein the at least one inner electrode provided on the inside surface of the first piezoelement and the at least on inner electrode provided on the inside surface of the at least one outer piezoelement are electrically connected in parallel, and the at least one outer electrode provided on the outside surface of the first piezoelement and the at least one outer electrode provided on the outside surface of the at least one outer piezoelement are electrically connected in parallel.

5. The piezoelectric actuator according to claim 1, wherein the first piezoelement has a tubular form and an inside surface and an outside surface and the at least one outer piezoelement has a tubular form and an inside surface and an outside surface, further comprising at least one inner electrode provided on the inside surface of the first piezoelement, at least one outer electrode provided on the outside surface of the first piezoelement, at least one inner electrode provided on the inside surface of the at least one outer piezoelement, and at least one outer electrode provided on the outside surface of the at least one outer piezoelement, wherein the at least one inner electrode provided on the inside surface of the first piezoelement and the at least one inner electrode provided on the inside surface of the at least one outer piezoelement are electrically connected independently, and the at least one outer electrode provided on the outside surface of the first piezoelement and the at least one outer electrode provided on the outside surface of the at least one outer piezoelement are electrically connected independently achieving a stepped actuation lift of the piezoelectric actuator.

6. The piezoelectric actuator according to claim 1, wherein the at least one monolithic piezoelement is produced using an extrusion molding technique.

7. A piezoelectric actuator, comprising:
   at least one monolithic piezoelement of a piezoelectric material, having a tubular form and a penetrating bore extending alone a longitudinal direction and surrounded by a tubular wall, the at least one piezoelement including a first piezoelement having a first end and a second end and at least one outer piezoelement having a first end and a second end, wherein the at least one outer piezoelement is concentrically disposed around the first piezoelement and connected by a connecting element, the connecting element connecting the second end of the first piezoelement to the first end of the at least one outer piezoelement and having a pot-shaped design including a cup-type base connected to the second end of the first piezoelement, a collar section connected to the first end of the at least one outer piezoelement, and a cylinder section joining the cup-type base to the collar section;

at least one inner electrode provided on an inside of the tubular wall surrounding the at least one piezoelement; and at least one outer electrode provided on an outside of the tubular wall surrounding the at least one piezoelement, wherein when an electric voltage is applied between the at least one inner electrode and the at least one outer electrode an electrical field aligned substantially perpendicularly to the longitudinal direction of the at least one piezoelement is formed wherein the electrical field deforms the at least one piezoelement in the longitudinal direction causing the at least one piezoelement to exert an actuation force in the longitudinal direction.

8. The piezoelectric actuator according to claim 7, wherein the cylinder section of the connecting element is arranged in an annular space between the first piezoelement and the at least one outer piezoelement.

9. A piezoelectric actuator, comprising:

at least one monolithic piezoelement of a piezoelectric material, having a tubular form and a penetrating bore extending along a longitudinal direction and surrounded by a tubular wall, the at least one piezoelement including a first piezoelement having a first end and a second end and at least one outer piezoelement having a first end and a second end, wherein the at least one outer piezoelement is concentrically disposed around the first piezoelement and connected by a connecting element, the connecting element connecting the second end of the first piezoelement to the first end of the at least one outer piezoelement, and wherein the second end of the at least one outer piezoelement is connected to a reciprocating piston, wherein the reciprocating piston is connected with force-locking to a valve-closure member of a fuel injector, and the first end of the first piezoelement is braced against a housing of the fuel injector;

at least one inner electrode provided on an inside of the tubular wall surrounding the at least one piezoelement; and at least one outer electrode provided on an outside of the tubular wall surrounding the at least one piezoelement, wherein when an electric voltage is applied between the at least one inner electrode and the at least one outer electrode an electrical field aligned substantially perpendicularly to the longitudinal direction of the at least one piezoelement is formed, wherein the electrical field deforms the at least one piezoelement in the longitudinal direction causing the at least one piezoelement to exert an actuation force in the longitudinal direction.

10. The piezoelectric actuator according to claim 7, wherein the first piezoelement and the at least one outer piezoelement are in radial symmetry and arranged concentrically around a shared longitudinal axis running in the longitudinal direction.

11. The piezoelectric actuator according to claim 10, wherein the connecting element is in radial symmetry with the first piezoelement and the at least one outer piezoelement and is arranged concentrically around the longitudinal axis common to the first piezoelement and the at least one outer piezoelement.

12. The piezoelectric actuator according to claim 7, wherein the first piezoelement has a tubular form and an inside surface and an outside surface and the at least one outer piezoelement has a tubular form and an inside surface and an outside surface, further comprising at least one inner electrode provided on the inside surface of the first piezoelement, at least one outer electrode provided on the outside surface of the first piezoelement, at least one inner electrode provided on the inside surface of the at least one outer piezoelement, and at least one outer electrode provided on the outside surface of the at least one outer piezoelement, wherein the at least one inner electrode provided on the inside surface of the first piezoelement and the at least on inner electrode provided on the inside surface of the at least one outer piezoelement are electrically connected in parallel, and the at least one outer electrode provided on the outside surface of the first piezoelement and the at least one outer electrode provided on the outside surface of the at least one outer piezoelement are electrically connected in parallel.

13. The piezoelectric actuator according to claim 7, wherein the first piezoelement has a tubular form and an inside surface and an outside surface and the at least one outer piezoelement has a tubular form and an inside surface and an outside surface, further comprising at least one inner electrode provided on the inside surface of the first piezoelement, at least one outer electrode provided on the outside surface of the first piezoelement, at least one inner electrode provided on the inside surface of the at least one outer piezoelement, and at least one outer electrode provided on the outside surface of the at least one outer piezoelement, wherein the at least one inner electrode provided on the inside surface of the first piezoelement and the at least one inner electrode provided on the inside surface of the at least one outer piezoelement are electrically connected independently, and the at least one outer electrode provided on the outside surface of the first piezoelement and the at least one outer electrode provided on the outside surface of the at least one outer piezoelement are electrically connected independently achieving a stepped actuation lift of the piezoelectric actuator.

14. The piezoelectric actuator according to claim 7, wherein the second end of the at least one outer piezoelement is connected to a reciprocating piston, wherein the reciprocating piston is connected with force-locking to a valve-closure member of a fuel injector, and the first end of the first piezoelement is braced against a housing of the fuel injector.

15. The piezoelectric actuator according to claim 7, wherein the at least one monolithic piezoelement is produced using an extrusion molding technique.

* * * * *

UNITED STATES PATENT AND TRADEMARK OFFICE
CERTIFICATE OF CORRECTION

PATENT NO. : 6,025,671
DATED : February 15, 2000
INVENTOR(S) : Friedrich Boecking Page 1 of 1

It is certified that error appears in the above-identified patent and that said Letters Patent is hereby corrected as shown below:

Column 5,
Lines 20 and 22, change "... $d_3$ ..." to -- $d_{31}$ --.

Signed and Sealed this

Twenty-fifth Day of September, 2001

Attest:

NICHOLAS P. GODICI
Attesting Officer
Acting Director of the United States Patent and Trademark Office